United States Patent
Whitney et al.

(10) Patent No.: US 6,935,879 B2
(45) Date of Patent: Aug. 30, 2005

(54) CONNECTORS HAVING CIRCUIT PROTECTION

(75) Inventors: Stephen J. Whitney, Lake Zurich, IL (US); David Perry, Lakewood, IL (US)

(73) Assignee: Littelfuse, Inc., Des Plaines, IL (US)

( * ) Notice: Subject to any disclaimer, the term of this patent is extended or adjusted under 35 U.S.C. 154(b) by 426 days.

(21) Appl. No.: 10/192,288

(22) Filed: Jul. 10, 2002

(65) Prior Publication Data

US 2003/0013324 A1 Jan. 16, 2003

Related U.S. Application Data

(60) Provisional application No. 60/304,331, filed on Jul. 10, 2001.

(51) Int. Cl.[7] ............................. H01R 13/53; H01C 7/10
(52) U.S. Cl. ....................... 439/181; 439/510; 439/620; 439/225
(58) Field of Search .......................... 439/181, 88, 620, 439/510, 225; 361/56, 120, 127, 111, 961; 338/21

(56) References Cited

U.S. PATENT DOCUMENTS

| | | | | |
|---|---|---|---|---|
| 4,928,199 A | * | 5/1990 | Diaz et al. ..................... | 361/56 |
| 5,183,698 A | * | 2/1993 | Stephenson et al. ........ | 428/209 |
| 5,262,754 A | * | 11/1993 | Collins ......................... | 338/21 |
| 5,278,535 A | * | 1/1994 | Xu et al. ....................... | 338/20 |
| 5,483,407 A | * | 1/1996 | Anastasio et al. ............. | 361/56 |
| 6,382,997 B2 | * | 5/2002 | Semmeling et al. ........ | 439/181 |
| 6,542,065 B2 | * | 4/2003 | Shrier et al. .................. | 338/21 |
| 6,729,907 B1 | * | 5/2004 | Edenhofer et al. .......... | 439/620 |

* cited by examiner

*Primary Examiner*—Neil Abrams
(74) *Attorney, Agent, or Firm*—Bell, Boyd & Lloyd LLC

(57) ABSTRACT

The present invention provides connectors having circuit protection. Specifically, the present invention provides a device that operates with existing or new connectors to provide overvoltage protection to same. The device includes a strip of conductive material along which voltage variable material ("VVM") is applied. The strip also includes an exposed portion not having the VVM deposition. The VVM contacts a plurality of signal conductors of the connector. The exposed portion contacts at least one ground conductor of the connector. When an overvoltage condition occurs along one of the signal conductors, the VVM switches from a high impedance to a low impedance state, allowing the transient threat to dissipate, at least in part, to one or more ground conductor.

21 Claims, 5 Drawing Sheets

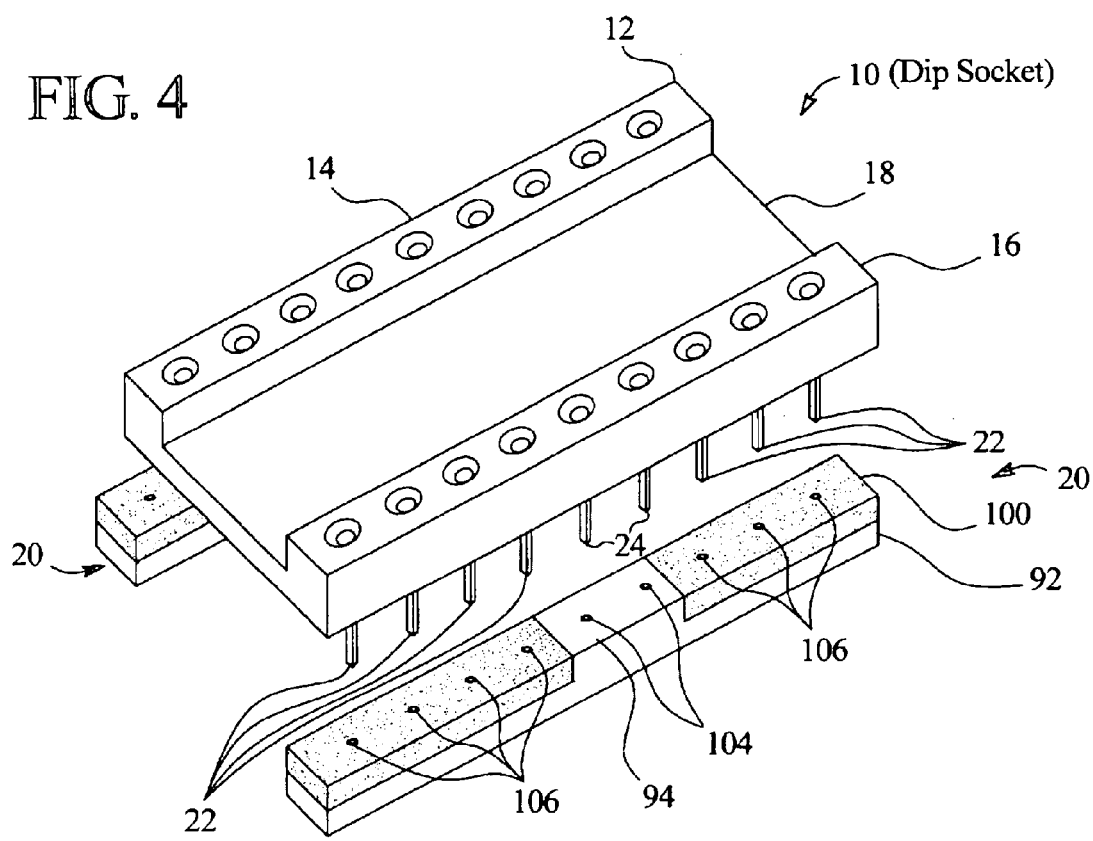
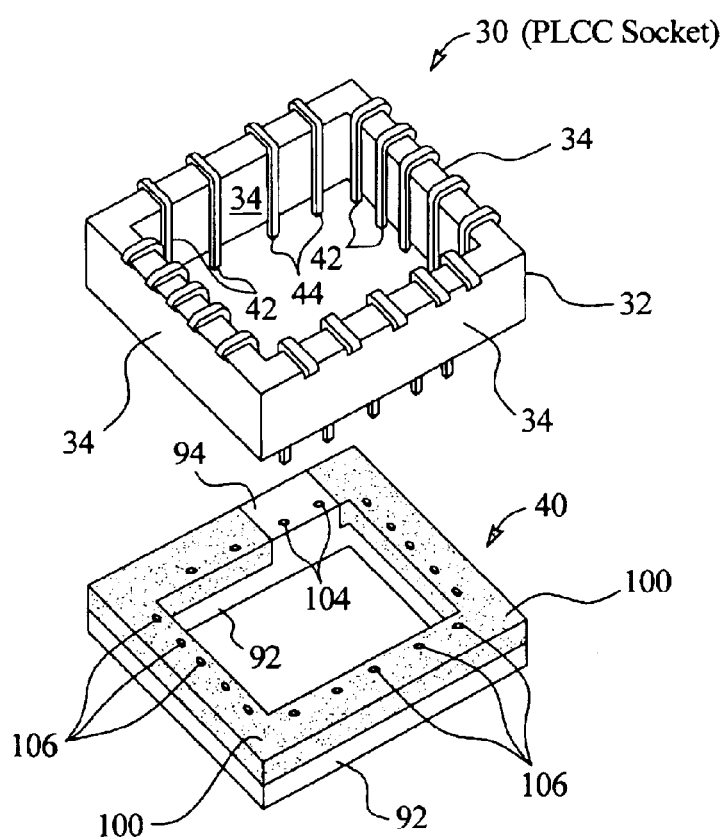

US 6,935,879 B2

CONNECTORS HAVING CIRCUIT PROTECTION

PRIORITY CLAIM

This application is a non-provisional application claiming the benefit of Provisional U.S. Patent Application No. 60/304,331, filed Jul. 10, 2001, having the same title as above.

BACKGROUND OF THE INVENTION

The present invention generally relates to electrical connectors. More specifically, the present invention relates to connectors having circuit protection.

Electrical overstress transients ("EOS transients") produce high electric fields and high peak currents that can render circuits, or the highly sensitive electrical components in the circuits, temporarily or permanently non-functional. EOS transients may arise, for example, from an electromagnetic pulse, an electrostatic discharge, e.g., from a device or a human body, lightning, a build up of static electricity or be induced by the operation of other electronic or electrical components. An EOS transient can rise to its maximum amplitude in subnanosecond to microsecond times and have repeating amplitude peaks.

The peak amplitude of the electrostatic discharge (ESD) transient wave may exceed 25,000 volts with currents of more than 100 amperes. There exist several standards which define the waveform of the EOS transient. These include IEC 1000-42, ANSI guidelines on ESD (ANSI C63.16), DO-160, and FAA-20-136. There also exist military standards, such as MIL STD 461/461 and MIL STD 883 part 3015.

Materials exist for the protection against EOS transients, which are designed to respond rapidly (i.e., ideally before the transient wave reaches its peak) to reduce the transmitted voltage to a much lower value and clamp the voltage at the lower value for the duration of the EOS transient. EOS materials are characterized by having high electrical impedance values at low or normal operating voltages and currents. In response to an EOS transient, the materials switch essentially instantaneously to a low electrical impedance state. When the EOS threat has been mitigated, these materials return to their high impedance state. These materials are capable of repeated switching between the high and low impedance states, allowing circuit protection against multiple EOS events.

EOS materials also recover essentially instantaneously to their original hill impedance state upon termination of the EOS transient. EOS materials can switch to the low impedance state thousands of times, withstanding thousands of ESD events, and recover to the high impedance state after providing protection from each of the individual ESD events.

Circuit components utilizing EOS materials can shunt a portion of the excessive voltage or current due to the EOS transient to ground, protecting the electrical circuit and its components. The major portion of the threat transient, however, is reflected back towards the source of the threat. The reflected wave is either attenuated by the source, radiated away, or re-directed back to the surge protection device which responds to each return pulse until the threat energy is reduced to safe levels.

EOS devices, such as devices employing a polymeric voltage variable material ("VVM") have been typically provided in the form of discrete components, for example, surface-mountable to a printed circuit board ("PCB"). While these devices have enjoyed considerable commercial success, they do have certain limitations.

First, it is always desirable for cost, spacing/flexibility and reliability purposes, to reduce the number of components that are required to be mounted to the PCB. Adding an overvoltage protection device to a board layout needing protection consumes valuable board space and adds to the potential for defects and electrical mismatching.

Second, adding components to a PCB requires a redesign or an incorporation into a currently pending design, which requires that the application is not yet in production or that a new release will have to be made. The majority of existing equipment cannot therefore make use of voltage variable materials without a significant redesign.

Third, transient voltage spikes emanate from events that occur outside of the PCB and are transmitted to the PCB through cables and wires. For instance, networked computer and telephone systems are subject to a variety of transients caused by environmental and handling activities. In these situations, it would be desirable to eliminate transients or overcurrent conditions before they reach the PCB, that is at the connector or cable level. Most overvoltage protection devices today are surface-mountable for the reason that the PCB has provided the most convenient place to mount the devices.

Also, certain peripheral devices that operate in a system environment, such as a disk drive, may not be currently protected by overvoltage protection devices that are located on the PCB. It is therefore desirable to provide a way to protect these peripheral devices.

SUMMARY OF THE INVENTION

The present invention provides connectors having circuit protection. Specifically, the present invention provides a device that allows overvoltage protection to occur at the connector or cable level. The device of the present invention provides protection directly onto the connector, which can be a PCB mounted connector, a cable-mounted connector or a machine-mounted connector. In each case, PCB space is conserved because the device mounted directly to the connectors would otherwise have to be mounted the PCB. The device of the present invention also provides overvoltage protection to existing connectors, which would not be otherwise protectable.

To this end, in an embodiment of the present invention, a circuit protection device for mounting to an existing or new connector is provided. The device includes a conductive strip and a layer of voltage variable material ("VVM") adhered to the conductive strip. The VVM of the present invention is in one embodiment self-curable and self-adhesive and does not require a separate housing, rather, the conductive strip provides the shape and the area, e.g., the length and width of the VVM. This is the area available for contacting multiple conductors or pins of the connector.

The device can be configured in various ways so that the conductive strip makes electrical contact with one or more ground pins of the connector, while the signal pins or conductors of the connector are separated from the conductive strip by a layer of VVM. In a preferred embodiment, the thickness of the layer of VVM is less than the smallest spacing between any two signal conductors, so that a transient surge along one of the signal lines is shunted through the VVM to the conductive strip, rather than to another signal pin.

In one embodiment, a member extends from the conductive strip and contacts one or more ground pins. The member or portion of the strip is not covered by the VVM layer. In another embodiment, the conductive strip is bent so that the strip contacts the ground pins but not the signal conductors. In an embodiment, the device includes a dielectric or insulative, e.g., plastic, backing or member that covers the side of the strip opposite the side that adheres to the VVM. The plastic body can include a protrusion that pushes the conductive strip, in a desired place, to contact the ground pins but not the signal conductors. Alternatively, the conductive strip (and possibly the VVM layer) can be bent around the ground pins, so that the back side of the metal strip contacts the ground conductors.

The device of the present invention can be an aftermarket device, which is obtained, for example, by an end-user of the connector or by an original equipment manufacturer ("OEM"), who is installing the connector into a piece of equipment. Alternatively, the device of the present invention can be made and installed by the manufacturer of the connector, who can modify the design of the connector to optimize the application of the VVM and conductive strip and the resulting size and shape of a connector employing same. As alluded to above, the connectors of the present invention are in an embodiment telecommunications or computer signal connectors, which include signal conductors that are highly sensitive to environmental voltage fluctuations.

In one embodiment of the present invention, an electrical socket having circuit protection is provided. In various implementations, the socket can be either a dual inline package socket or a plastic leaded chip carrier socket. The socket includes a socket body. A plurality of pins extend from the body including, for example, a voltage supply pin, signal or data transmission conductors and one or more ground pills. A strip of conductive metal having a self-resetting VVM layer is positioned within the body such that the strip contacts the ground pin(s) and the VVM contacts the signal conductors. In an embodiment, the conductive metal strip is integral to the body. In another embodiment, the conductive metal strip is supported by an additional dielectric backing, wherein the backing, strip and VVM layer can be placed onto the socket after its manufacture.

In another embodiment of the present invention, a computer input/output connector having circuit protection is provided. The input/output connector includes a body having a wall extending in multiple directions so as to create an interior space. A plurality of signal conductors and at least one ground pin are maintained within the interior space and are positioned substantially parallel to the wall. A strip of conductive metal having a self-resetting VVM layer is positioned within the connector body such that the strip contacts the ground pin(s) and the VVM contacts the signal conductors. In an embodiment, the conductive metal strip is integrally supported by the connector body. In another embodiment, the conductive metal strip is supported by an additional dielectric backing, wherein the backing, strip and VVM layer can be placed onto the connector after its manufacture.

In an embodiment, the connector meets Deutsches Institut für Normung eV ("DIN") standards. The connector body can be round, be in the shape of a "D" type connector or be any other type of computer connector. In an embodiment, the body is formed of multiple pieces, wherein the connector includes a ribbon cable crimped between the pieces of the body.

In yet another embodiment of the present invention, a data/telecommunications connector is provided. The connector in an embodiment is a jack, which includes a body defining an opening that receives a plug. In another embodiment, the body of the connector is a plug body. In either case, a plurality of signal conductors and at least one ground conductor are secured to the body. A strip of conductive metal having a self-resetting VVM layer is positioned within the connector body such that the strip contacts the ground pin(s) and the VVM contacts the signal conductors. In an embodiment, the conductive metal strip is integral to the connector body. In another embodiment, the conductive metal strip is supported by an additional dielectric backing, wherein the backing, strip and VVM layer can be placed onto the connector after its manufacture.

The ground conductor can be either a signal ground or a shield ground. The conductors in an embodiment connect electrically to traces on a PCB. In an embodiment, the body is a jack or plug of an RJ-11 connector, an RJ-45 connector, a USB connector or a firewire connector.

It is therefore an advantage of the present invention to provide a device that can be mounted to existing connectors to provide overvoltage protection to same.

Another advantage of the present invention is to provide an apparatus that can be manufactured with a connector to provide overvoltage protection to same.

A further advantage of the present invention is to provide an apparatus that simultaneously protects multiple signal conductors of a telecommunications or computer connector.

Still a further advantage of the present invention is to provide self-resetting overvoltage protection to connectors.

Yet another advantage of the present invention is to provide a socket having overvoltage protection.

Yet a further advantage of the present invention is to provide a DIN and a multi-DIN connector having overvoltage protection.

Still another advantage of the present invention is to provide RJ type, firewire and USB type connectors having overvoltage protection.

Moreover, an advantage of the present invention is to provide a ribbon cable connector having overvoltage protection.

Additional features and advantages of the present invention will be described in, and apparent from, the following Detailed Description of the Preferred Embodiments and the Drawings.

BRIEF DESCRIPTION OF THE FIGURES

FIG. 4 is a perspective view of one embodiment of one type of socket connector attached to a device according to the principles of the present invention.

FIG. 5 is a perspective view of one embodiment of another type of socket connector attached to a device according to the principles of the present invention.

DETAILED DESCRIPTION OF THE INVENTION

Figure 1A:
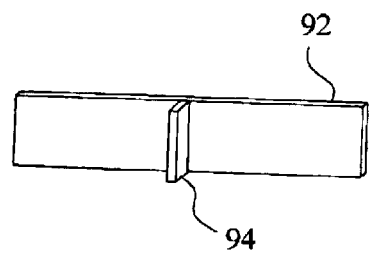
FIGS. 1A to 1C illustrate a process of making one embodiment of the device of the present invention and various views of a connector attached to a device according to the principles of the present invention.
Figure 1B:
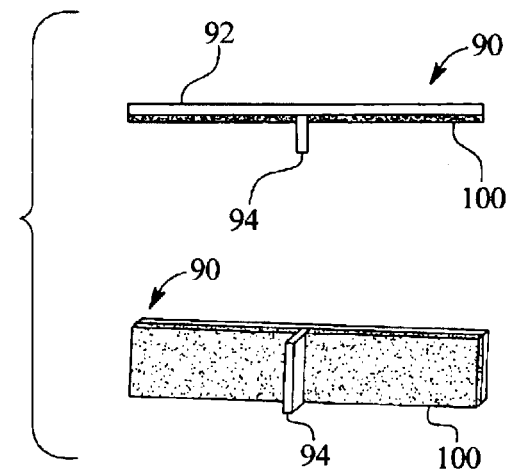
Figure 1C:
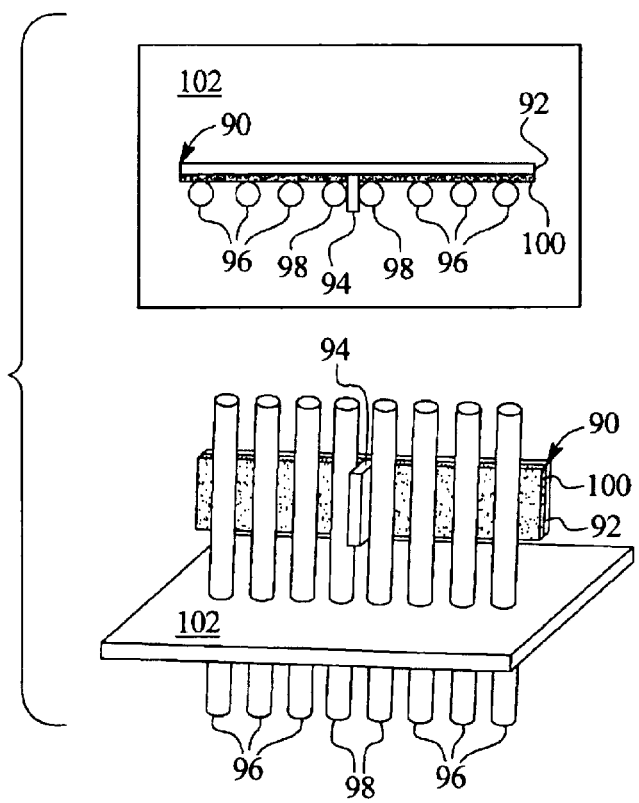

Referring now to the drawings and in particular to FIGS. 1A to 1C, one embodiment of a device 90 of the present invention is illustrated. FIG. 1A illustrates that the device 90 includes a conductive metal strip 92, which has a member or portion 94 extending therefrom. In the illustrated embodiment, the member or portion 94 protrudes from the middle of the strip 92, however, as will be appreciated below, member 94 can be located anywhere along strip 92, including the end of the strip. Member 94 can be welded, soldered or integrally formed, e.g., stamped or bent to or from strip 92. The strip 92 and member 94 can be of the same or of different metals or alloys. Either the strip 92 or the member 94 can be: nickel, carbon black, aluminum, silver, gold, copper and graphite, zinc, iron, stainless steel, tin, brass, and alloys thereof, and conducting organic materials, such as intrinsically conducting polymers, etc.

FIG. 1B illustrates a perspective front view and a top plan view of the device 90, wherein a VVM layer 100 has been applied along the surface of the strip 92 from which the member or portion 94 protrudes. The member 94, however, remains at least partially uncoated. The VVM layer 100 can be brushed or screen-printed onto the strip 92. VVM 100 is made in one embodiment using an insulative binder that can be printed or otherwise spread across a metallic or nonmetallic surface or substrate. The VVM 100 in an embodiment is the VVM disclosed in U.S. patent application Ser. No. 10/410,393, entitled "Voltage Variable Material for Direct Application and Devices Employing Same", and assigned to the assignee of the present invention. This VVM intrinsically adheres to surfaces, such as a conductive, metal surface or a non-conductive, insulative surface or substrate. This VVM can cure by itself without additional processing. The device 90 With this VVM can be cured however to speed the manufacturing process of same.

The self-curing and self-adhering insulative binder of the VVM disclosed in patent application Ser. No.10/410,393 includes a polymer or thermoplastic resin, such as polyester, which is dissolved in a solvent. The polyester resin has a glass transition temperature in the range of 6° C. to 80° C. and a molecular weight between 15,000 and 23,000 atomic mass units. One suitable solvent for dissolving the polymer is diethylene glycol monoethyl ether acetate, commonly referred to as "carbitol acetatate". In an embodiment, a thickening agent is added to the insulative binder, which increases the viscosity of the insulative binder. For example, the thickening agent can be a fumed silica, such as that found under the tradename Cab-o-Sil TS-270.

The insulative binder of the present invention has a high dielectric breakdown strength, a high electrical resistivity and high tracking impedance. The insulative binder provides and maintains sufficient interparticle spacing between the other possible components of VVM 100, such as conductive particles, insulating particles, semiconductive particles, doped semiconductive particles and various combinations of these. The interparticle spacing, the resistivity and the dielectric strength of the insulative binder each affect the high impedance quality of the VVM in its normal state. In an embodiment, the insulative binder has a volume resistivity of at least $10^9$ ohm-cm. It is possible to blend different polymers in the binder of the VVM and to cross-link the binder.

Other VVM's that may be suitable in certain embodiments of the present invention are known to those of skill in the art. For example, VVM 100 can include the composition disclosed in U.S. Pat. No. 6,251,513, entitled "Polymer Composites for Overvoltage Protection", which includes a matrix of conductive and semiconductive particles having an average particle size of less than 10 microns. The matrix further includes insulative particles having an average particle size larger than 300 angstroms. The compositions, which use relatively small particle sized conductive and semiconductive fillers, exhibit clamping voltages in a range of about 30 volts to about 2,000 volts or greater. In other embodiments, VVM 100 may include any of the following compositions.

U.S. Pat. No. 2,273,704, issued to Grisdale, discloses granular composites which exhibit non-linear current/voltage relationships. These mixtures are comprised of conductive and semiconductive granules that are coated with a thin insulative layer and are compressed and bonded together to provide a coherent body.

U.S. Pat. No. 2,796,505, issued to Bocciarelli, discloses a non-linear voltage regulating element. The element is comprised of conductor particles having insulative oxide surface coatings that are bound in a matrix. The particles are irregular in shape and make point contact with one another.

U.S. Pat. No. 4,726,991 issued to Hyatt et a., discloses an EOS protection material comprised of a mixture of conductive and semiconductive particles, all of whose surfaces are coated with an insulative oxide film. These particles are bound together in an insulative binder. The coated particles are preferably in point contact with each other and conduct preferentially in a quantum mechanical tunneling mode.

U.S. Pat. No. 5,476,714, issued to Hyatt, discloses EOS composite materials comprised of mixtures of conductive and semiconductive particles sized to be in a 10 to 100 micron range. The materials also include a proportion of 100 angstrom sized insulative particles. All of these materials are bonded together in a insulative binder. This invention includes a grading of particle sizes such that the composition causes the particles to take a preferential relationship to each other.

U.S. Pat. No. 5,260,848, issued to Childers, discloses foldback switching materials which provide protection from transient overvoltages. These materials are comprised of mixtures of conductive particles in the 10 to 200 micron range. Semiconductor and insulative particles are also employed in these compositions. The spacing between conductive particles is at least 1000 angstroms.

Additional EOS polymer composite materials are also disclosed in U.S. Pat. Nos. 4,331,948, 4,726, 991, 4,977, 357, 4,992,333, 5,142,263, 5,189,387, 5,294,374, 5,476,714, 5,669,381 and 5,781,395, the teachings of which are specifically incorporated herein by reference.

In the embodiment illustrated in FIG. 1B, the member 94 extends past the thickness of the VVM layer 100. In alternative embodiments illustrated below, the member or portion 94 is substantially flush with the VVM layer 100. Also illustrated below, the conductive strip 92 and the VVM layer 100 can define a plurality of apertures that are sized and positioned to receive signal conductors and/or ground conductors.

FIG. 1C illustrates a perspective front view and a top plan view of the device 90 including the VVM layer 100, wherein the device 90 has been abutted against a plurality of signal conductors 96 and at least one ground conductor 98 of a connector. The device 90 can be abutted against the conductors 96 and 98 during the manufacture of the connector, i.e., before the first sale of same. The device 90 is alternatively configured to be an aftermarket device that is attachable to the connector after the first sale of the connector.

The connector includes a mount 102 that holds the conductors 96 and 98 in place and in relative position. The illustrated embodiment shows the ground conductors 98 mounted between various signal conductors 96. It should be appreciated however that any one or more of the conductors, such as the conductors on the end, can be a ground conductor 98.

In the illustrated embodiment, the VVM layer 100 extends along and contacts a length of the signal conductors 96. The VVM layer 100 can also contact the ground conductors 98, however, the ground conductors 98 should also contact the bare metal of the member 94 or strip 92. The conductive member or portion 94 forms part of a direct electrical path from the strip 92 to one or more earth ground or shield ground conductors 98.

Viewing FIG. 1C, under normal conditions the VVM layer 100 is in a high impedance state, wherein no current or very little current flows from the signal conductors 96 to the conductive strip 92 through VVM layer 100. When an overvoltage condition occurs, the VVM layer 100 switches to a low impedance state. At least a portion of the high voltage spike travels across the VVM layer 100 to the conductive strip 92, to the portion or member 94, and then to ground via the one or more conductors 98. As stated above, much of the transient wave is reflected back along the corrupted signal conductor 96 towards the source of the overvoltage condition. The thickness of the layer 100 should be less than the spacing between the signal conductors 96, so that the shunted energy takes the path of least resistance to the strip 92 rather than to another signal conductor 96.

Figure 2:
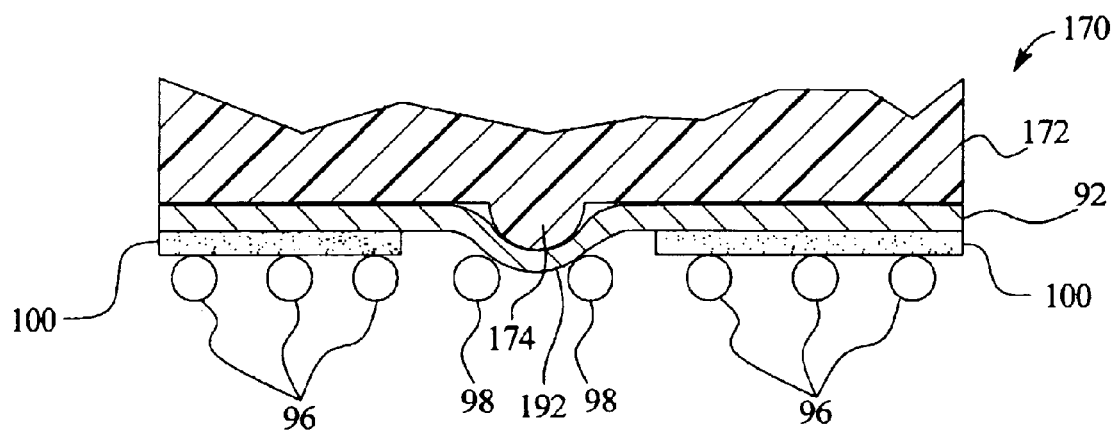
FIGS. 2 and 3 illustrate alternative embodiments of the device of the present invention.

Referring now to FIG. 2, an alternative device 170 of the present invention is illustrated. As with device 90, the device 170 includes the conductive strip 92, one side of which includes a deposited VVM layer 100. A portion 192 of the strip 92 is bent or formed to make direct metal to metal contact with the ground conductors 98. The VVM layer 100 is discontinued on and around the portion 192 of the strip 92, so that the strip 92 can make contact with the ground conductors 98. The same side of the strip 92 that makes contact with the ground conductors 98 also attaches to the VVM layer 100. As above with device 90, the device 170 may be modified for any number and arrangement of ground conductors 98 relative to the signal conductors 96, including the ground conductors 98 being located at one or both ends of the device 170.

The device 170 also includes an insulative backing 172 disposed on the side of the strip 92 opposite the side onto which the VVM layer 100 is placed. The insulative backing 172 can be made of any type of dielectric material, such as plastic. It should be appreciated that the device 90 could also have a backing. Device 90 is illustrated without a backing to emphasize that the present invention does not require Such a backing. As with the device 90, the device 170 can be installed during the original assembly of the connector and the conductors 96 and 98 or can be installed as an aftermarket device after the first sale of the connector. To this end, the backing 172 call be part of the original assembly of the connector, e.g., molded integrally with the connector housing. Alternatively, the backing 172 can be formed with snap-fits or be formed to press-fit to the connector for aftermarket connection.

The backing 172 includes a projection 174 formed integrally or attached to the backing 172. The projection 174 fills-in or follows the bent portion 192 of the strip 92. The projection 174 applies a mechanical force to the bent portion 192 of the strip 92 and helps to keep the strip pressed against the ground conductors 98. As above with device 90, the thickness of VVM layer 100 should be less than the distance between the signal conductors 96, wherein the VVM layer 100 extends along and contacts a length of the signal conductors 96.

The device 170 operates the same as described above for the device 90. Normally, no current or little current flows from the signal conductors 96 through the high impedance VVM layer 100 to the conductive strip 92. When an overvoltage condition arises on any of the signal conductors 96, the VVM layer 100, or a separate portion thereof that contacts the corrupted conductor 96 (device 170 illustrated as having separate VVM layer portions), switches to a low impedance state and allows current to shunt through to the strip 92, to the bent portion 192 of the strip 92, and to one or more ground conductors 98.

Figure 3:
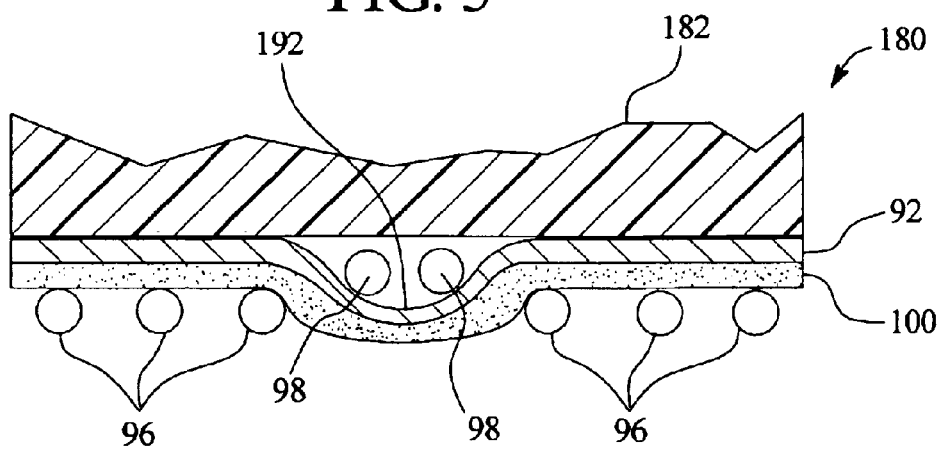

Referring now to FIG. 3, a further alternative device 180 of the present invention is illustrated. As with devices 90 and 170, the device 180 includes the conductive strip 92, one side of which includes a deposited VVM layer 100. A portion 192 of the strip 92 is bent or formed to make direct metal to metal contact with the ground conductors 98. Unlike the device 170, the VVM layer 100 is continuous on and around the portion 192 of the strip 92. The VVM 100 could alternatively discontinue, e.g., on and around the portion 192. Here, the side of the strip 92 opposite from the side attached to the VVM layer 100 makes contact with the ground conductors 98. As with devices 90 and 170, device 180 may be modified for any number and arrangement of ground conductors 98 relative to the signal conductors 96, including the ground conductors 98 being located at one or both ends of the device 180.

The device 180 also includes an insulative backing 182 disposed on the side of the strip 92 opposite the side onto which the VVM layer 100 is placed. The insulative backing 182 can be made of any type of dielectric material, such as plastic. As with devices 90 and 170, device 180 can be installed during the original assembly of the connector and the conductors 96 and 98 or can be installed as an aftermarket device after the first sale of the connector. To this end, the backing 182 can be part of the original assembly of the connector, e.g., molded integrally with the connector housing. Alternatively, the backing 182 can be formed with snap-fits or be formed to press-fit to the connector for aftermarket connection.

Unlike the backing 172 of device 170, backing 182 does not require a projection to make and maintain contact between the strip 92 and the ground conductors 98. The bent portion 192 is pulled against ground conductors 98 and applies a mechanical force to same, which helps to keep the strip 92 pressed against the ground conductors 98. As with devices 90 and 170, the VVM layer 100 extends along and contacts a length of the signal conductors 96.

The device 180 operates the same as described above for the devices 90 and 170. Normally, no current or little current flows from the signal conductors 96 through the high impedance VVM layer 100 to the strip 92. When an overvoltage condition is present on any of the signal conductors 96, the VVM layer 100 switches to a low impedance state and allows current to shunt through to the strip 92, to the bent portion 192 of the strip 92, and to one or more ground conductors 98.

Referring now to FIGS. 4 and 5, a variety of socket connectors may be equipped with circuit protection using a device according to the principles of the present invention. FIG. 4 illustrates a common dual-in-line ("DIP") socket connector 10. The DIP socket 10 includes a body 12 that is constructed of an insulating material such as a glass-filled polyester material. The body 12 includes two ridges 14 and 16 and a bridge piece 18 connecting the ridges 14 and 16.

Each of the ridges 14 and 16 includes a plurality of conductive signal pins 22 and one or more ground pins 24. The pins 22 and 24 typically connect electrically to signal leads and ground leads, respectively, of an external printed circuit board ("PCB") (not illustrated). The socket connector 10 may include any number of conductive signal pins/conductors 22 and any number of conductive ground pins/conductors 24, which may be placed in any arrangement on the DIP socket 10.

The device 20 resembles the device 90, both of which include a member or portion 94 that is not covered by the VVM layer 100, and which can extend from the conductive strip 92. With the device 20, however, the portion 94 does not have to extend from the strip 92 to make electrical contact with the ground pins 24 (as with the device 90). The device 20 includes apertures 104 that receive the ground pins 24 and make and maintain electrical contact with same. More particularly, the portion 94 of the strip 92 that contacts the ground pins 24 defines apertures 104.

The apertures 104 may simply be holes, slots or any other suitably shaped apertures that are dimensioned to tightly allow the ground pins 24 to extend through the strip 92. The tight dimensioning of the apertures 104 with respect to the diameter or width of the ground pins 24 ensures proper electrical contact. The apertures 104 are alternatively spring clips, which are well known, and which include metal flaps bent slightly in the direction of insertion. As the ground pins 24 extend through the spring clip apertures 104, the bent metal flaps are forced open slightly, creating a biasing force that tends to keep the flaps pulled against the ground pins 24.

It should thus be appreciated that the portion 94 of the strip 92 does not have to project from the remainder of the strip 92 to make electrical contact with the ground pins 24. As illustrated, however, the portion 94 can be raised so as to be flush with the top of VVM layer 100, so that the portion 94 does not bend or distort when device 20 is press fit onto the socket connector 10.

The VVM 100 defines apertures 106, similar to the apertures 104, which cause the VVM layer 100 to contact the signal pins 22 when the device 20 is inserted onto the socket connector 10. Because the VVM 100 is malleable, apertures 106 can be significantly smaller in diameter or width than the diameter or width of the signal pills 22. The apertures 106 are forced open slightly by the insertion of the pins 22 and are thereafter biased to contact the signal pins 22. The apertures 106 can be holes or slots but are circular in one preferred embodiment to maximize surface contact with the signal pins 22. Alternatively, apertures 106 are not provided initially but are created by the insertion of the signal pins 22.

Beneath the apertures 106 in the VVM 100 are separate individual apertures or one or more elongated slots (not illustrated) that are sized to be a safe amount larger than the diameter or width of the signal pins 22. The oversized apertures or slots cause the strip 92 to not contact, i.e., to not make electrical contact with, the signal pills 22 when the device 20 is inserted onto the socket connector 10.

As illustrated, each ridge 14 and 16 of the DIP socket 10 accepts a separate device 20. The VVM layer 100 should be thinner than the distance between the signal pins 22. It should further be appreciated that the device 20 as illustrated does not include a dielectric backing, however, one could be provided beneath the strip 92 if desired. Moreover, device 20 can be installed by the original manufacturer and modified accordingly or be installed by an enduser, etc.

The device 20 operates substantially the same as described above for the devices 90, 170 and 180. Normally, no current or little current flows from the signal pins 22 through the high impedance VVM layer 100 to the strip 92. When an overvoltage condition arises on any of the signal pins 22, the VVM layer 100 switches to a low impedance state and allows current to shunt through to the strip 92, to the portion 94 of the strip 92, and to one or more ground pins 24.

FIG. 5 illustrates an example of a plastic leaded chip carrier ("PLCC") socket connector 30 that has a body 32 with four adjoining bridges 34. Each of the bridges 34 secures a plurality of signal pins/conductors 42. At least one of the bridges 34 secures one or more ground pins/conductors 44. The pins 42 and 44 typically connect electrically to signal leads and ground leads, respectively, of an external PCB (not illustrated). The socket connector 30 may include any number of conductive signal pins/conductors 42 and any number of conductive ground pins/conductors 44, which may be placed in any arrangement on the PLCC socket 30.

FIG. 5 illustrates device 40, which resembles devices 20 and 90, all of which include a member or portion 94 that is not covered by the VVM layer 100, and which extends from the conductive strip 92. Similar to device 20, device 40 includes apertures 104 that receive the ground pins 44 and make and maintain electrical contact with the pins. More particularly, the portion 94 of the strip 92 that contacts the ground pins 44 defines apertures 104.

The apertures 104 of the device 40 are in an embodiment holes that are dimensioned to tightly engage the ground pins 44. The tight dimensioning of the apertures 104 with respect to the diameter or width of the ground pins 44 ensures proper electrical contact. It should thus be appreciated that the portion 94 of the strip 92 does need to project from the remainder of the strip 92 to make electrical contact with the ground pins 44. The apertures 104 of the portion 94 engage the ground pins 44 when the device 40 is inserted onto socket connector 30. The portion 94 is raised so as to be flush with the top of VVM layer 100. Apertures 104 can alternatively include spring clips as discussed elsewhere herein.

The VVM 100 in an embodiment defines apertures 106, similar to the apertures 104, which cause the VVM layer 100 to properly contact the signal pins 42 when the device 40 is inserted onto the PLCC socket connector 30. Because the VVM 100 is malleable, apertures 106 can be significantly smaller in diameter or width than the diameter or width of the signal pins 22. In an alternative embodiment, apertures 106 are not provided, wherein the signal pins 22 deform the malleable VVM layer 100 to create apertures 106 when the device 40 is pressed against the socket connector 30.

Device 40 is four sided and covers each of the bridges 34 of the socket 30. When device 40 is pressed onto the socket connector 30, the metal apertures, e.g., spring clips 104, align with and engage the ground pins 44 along each of the bridges 34 having ground pins 44 (only one bridge shown here for convenience). Further, when device 40 is pressed onto the socket connector 30, the VVM apertures 106, if any, align with and engage the signal pins 42 along each of the bridges 34.

As above, VVM layer 100 should be thinner than the distance between the signal pills 42. Device 40 can be installed by the original manufacturer and modified accordingly or be installed by an enduser, etc. Device 40 operates substantially the same as described above for the devices 20, 90, 170 and 180. Normally, 110 current or little current flows from the signal pins 42 through the high impedance VVM layer 100 to the strip 92. When an overvoltage condition is present on any of the signal pins 42, the VVM layer 100 switches to a low impedance state and allows current to shunt through to the strip 92, to the portion 94 of the strip 92, and to one or more ground pins 44.

Figure 6:
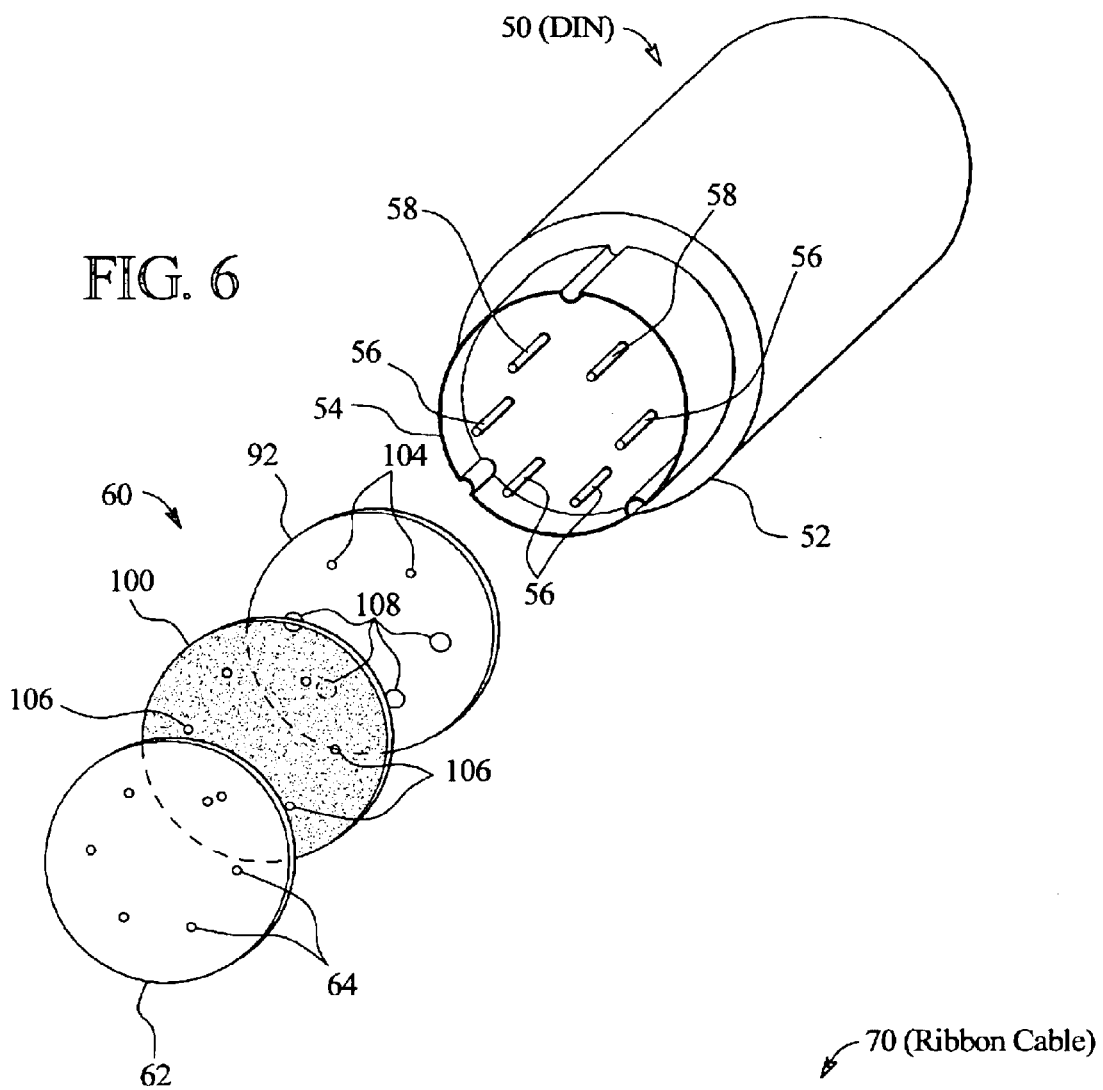
FIG. 6 is a perspective view of one embodiment of a DIN connector attached to a device according to the principles of the present invention.

Referring now to FIG. 6, a variety of computer connectors, for example, connectors that comply with the Deutsches Institut für Nonnung eV ("DIN") standards may be used with the devices of the present invention. A circular DIN connector 50 is illustrated. It should be appreciated from the forgoing discussion that the present invention is operable with any type of computer or DIN connector, such as miniature DIN connectors, double row elongated DIN connectors, shielded DIN connectors, etc. The present invention may be implemented in a computer plug or receptacle. Vertical, horizontal and in-line connectors that are either panel mounted, attached to computer equipment or attached to computer cables are also operable with the present invention.

The connector 50 includes a body 52 that is constructed of any suitable material. The body, in both plug and receptacle implementations, secures a circular wall 54 or a plurality of side walls 54 that at least partially encompass a plurality of signal conductors 56 and one or more ground conductors 58. The conductors 56 and 58 are substantially parallel with the circular wall 54 or multi-sided wall 54. If the body 52 is a plug, the conductors 56 and 58 are pins. If the body 52 is a receptacle, the conductors 56 and 58 are sockets that receive pins. The connector 50 may be configured so that the body 52 secures any number of conductors 56 and 58.

FIG. 6 illustrates a device 60 resembling the device 20, both of which include various sized apertures to allow a conductive strip or plate 92 to make contact with ground conductors but not with the signal conductors. The device 60 includes apertures 104 that receive the ground conductors 58 and make and maintain electrical contact with same. More particularly, the strip 92 defines the apertures 104.

The apertures 104 can be holes, slots or any other suitably shaped apertures that are dimensioned to tightly allow the ground conductors 58 to extend through the strip 92. The tight dimensioning of the apertures 104 with respect to the diameter or width of the ground conductors 58 ensures proper electrical contact. The apertures 104 are alternatively spring clips, which are well known as described above. As the ground conductors 58 extend through the spring clip apertures 104, the spring clips create a biasing force that tends to keep the clips pulled against the ground conductors 58. The spring clips are oriented outward towards the opening of the connector 50 if connector 50 is a plug. The spring clips are oriented inward towards the opening of the connector 50 if connector 50 is a jack.

The plate or strip 92 also defines clearance apertures or holes 108 that are significantly larger than the diameter or width of the signal conductors 56. The oversized apertures 108 cause the strip 92 to not contact, i.e., to not make electrical contact with, the signal conductors 56 when the device 60 is inserted between the wall or side walls 54 of the connector 50. It should also be appreciated that the individual oversized apertures could alternatively be one or more elongated clearance slots.

It should be appreciated that the order of the conductive strip 92 or the VVM layer 100 in the device 60 is not important functionally. It may be easier to handle the malleable VVM layer 100, however, when it is sandwiched between the metal plate 92 and an insulative, e.g., plastic, backing 62.

The VVM 100 defines apertures 106, similar to the apertures 104, which cause the VVM layer 100 to contact the signal conductors 56 when device 60 is inserted into the computer connector 50. Because the VVM 100 is malleable, apertures 106 can be significantly smaller in diameter or width than the diameter or width of the signal conductors 56. The apertures 106 are forced open slightly by the insertion of the conductors 56 and are thereafter biased to contact the signal conductors 56. The apertures 106 can be holes or slots but are circular in one preferred embodiment to maximize surface contact with the signal conductors 56. The VVM layer 100 need not contact the ground conductors 58 but does no harm by so doing. Alternatively, apertures 106 are not provided initially but are created by the insertion of the conductors 56 and 58.

Plastic backing 62 is provided with apertures 64 that can be sized to help hold the device 60 in place once inserted into connector 50. As stated above, The VVM layer 100 should be thinner than the distance between the signal conductors 56. Moreover, device 60 can be installed by the original manufacturer and modified accordingly or be installed by an enduser, OEM, etc.

The device 60 operates substantially the same as described above. Normally, no current or little current flows from the signal conductors 56 through the high impedance VVM layer 100 to the strip 92. When an overvoltage condition arises on any of the signal conductors 56, the VVM layer 100 switches to a low impedance state and allows current to shunt through to the strip 92 and to one or more ground conductors 58. In this manner, the device 60 can protect electrical devices that are either upstream or downstream from the connector 50.

Figure 7:
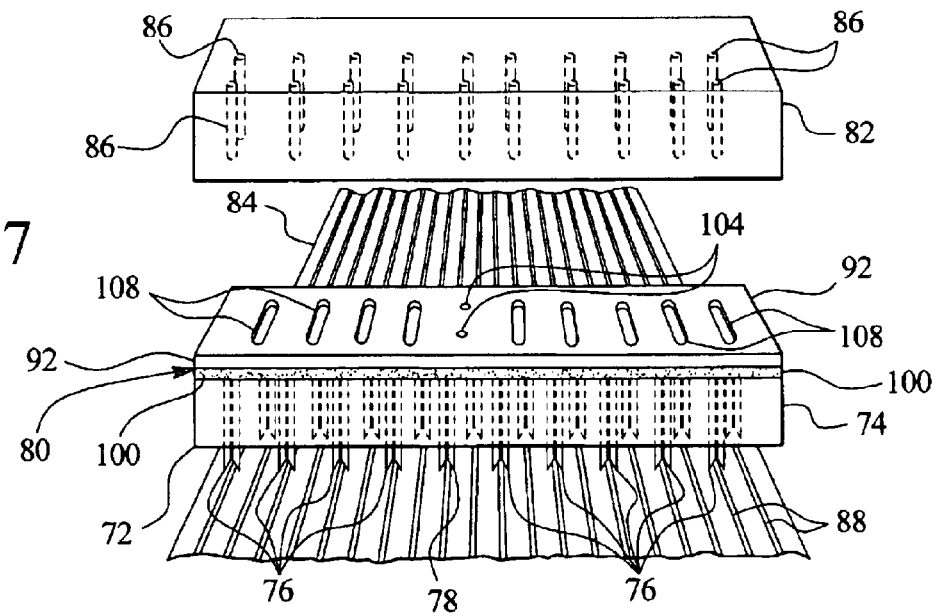
FIG. 7 is a perspective view of one embodiment of a ribbon cable connector attached to a device according to the principles of the present invention.

Referring now to FIG. 7, a computer ribbon cable connector 70 may be used with the devices of the present invention. The devices of the present invention can operate with any type of ribbon cable connector, such as a male, female, straight lead, right angle, straight lead/wire wrap and right angle/wire wrap version of a socket connector, D-connector, PCB connector, card edge connector, dip connector, pin connector or termination jumper. The present invention may be implemented in a plug or receptacle type ribbon connector.

The ribbon connector 70 includes a body 72 that is constructed of any suitable material, such as a plastic material. The body 72, in both plug and receptacle implementations, secures a wall or plurality of walls 74 that at least partially encompass a plurality of signal clips 76 and at least one ground clip 78. The clips 76 and 78 are substantially parallel with the wall or walls 74. Clips 76 and 78 connect electrically to pins 86 that extend downwardly within body 82. Clips 76 and 78 receive the electrical conductors 88 within ribbon cable 84. The ribbon connector 70 may be configured so that the body 72 secures any number of signal clips 76 and ground clips 78.

Below the body 72 lies a ribbon cable 84. Ribbon cable 84 may be any suitable cable including gray flat cable, color coded flat cable, twisted pair flat cable and round jacketed/shielded flat cable. In the illustrated embodiment, the second body 82 is a plug that fits over the receptacle body 72. Pins 86, connected to and housed inside plug body 82, electrically communicate with signal clips 76 and around clips 78. The clips 76 and 78 extending from the body 72 pierce the insulation of the cable 84 and create electrical contact with conductors 88 inside the cable 84.

FIG. 7 illustrates a device 80 that resembles the device 60, both of which include various sized apertures to allow a conductive plate 92 to make contact with the ground conductors 78 but not with the signal conductors 76. The device 80 includes apertures 104 that receive, make and maintain electrical contact with certain pins 86, which in turn connect electrically with the ground clips 78. More particularly, the strip 92 defines the apertures 104.

The apertures 104 can be holes, slots or any other suitably shaped apertures that are dimensioned to tightly allow the pins 86 to extend through the strip 92. The tight dimensioning of the apertures 104 with respect to the diameter or width of the pins 86 ensures proper electrical contact. The apertures 104 are alternatively spring clips, which are well known as described above. As the pins 86 extend through the spring clip apertures 104, the spring clips create a biasing force that tends to keep the clips pulled against the pins 86.

The plate or strip 92 also defines clearance apertures or holes 108 that are significantly larger than the diameter or width of the pins 86. The oversized apertures 108 cause the strip 92 to not contact, i.e., to not make electrical contact with, the pins 86 when the device 80 is crimped between mating bodies 72 and 82. It should also be appreciated that the individual oversized apertures be combined into one or more larger clearance apertures.

The order of the conductive strip 92 or the VVM layer 100 in the device 80 is not important functionally. The VVM 100 defines apertures (not illustrated), which cause the VVM layer 100 to contact certain pins 86 that connect electrically to signal clips 76 when the bodies 72 and 82 are compressed together. Because the VVM 100 is malleable, the VVM apertures can be significantly smaller in diameter or width than the diameter or width of the pins 86. The VVM apertures are forced open slightly by the insertion of the pins 86 and are thereafter biased to contact the pins 86. The apertures 106 can be holes or slots but are circular in one preferred embodiment to maximize surface contact with the pins 86. The VVM layer 100 need not contact the pins 86 that connect electrically with the ground clips 78 but does no harm by so doing. Alternatively, VVM apertures are not provided initially but are created by the insertion of the pins 86.

The plastic backing of the device 80 is provided by the top wall of the body 72 in an embodiment. As stated above, The VVM layer 100 should be thinner than the distance between the pins 86 that connect electrically to the signal clips 76. Moreover, device 80 can be installed by the original manufacturer and modified accordingly or be installed by an enduser, OEM, etc.

The device 80 operates substantially the same as described above. Normally, no current or little current flows from the conductors 88 of the cable 84 through the pins 86 and the high impedance VVM layer 100 to the strip 92. When an overvoltage condition arises on any of the conductors 88 of the cable 84 that connect electrically to signal clips 76, the VVM layer 100 switches to a low impedance state and allows current to shunt through to the strip 92 and to one or more pins 86 that connect to the ground clips 78. In this manner, the device 80 can protect electrical devices that are either upstream or downstream from the computer connector 70.

Figure 8:
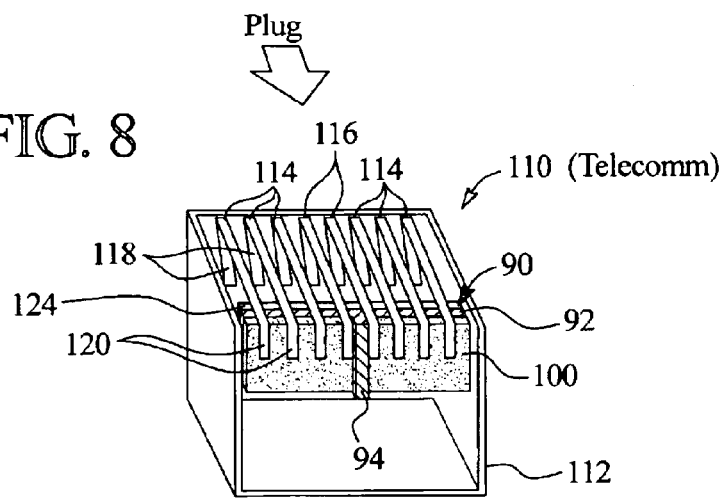
FIG. 8 is a cutaway perspective view of one embodiment of a data/telecommunications connector attached to a device according to the principles of the present invention.
Figure 9:
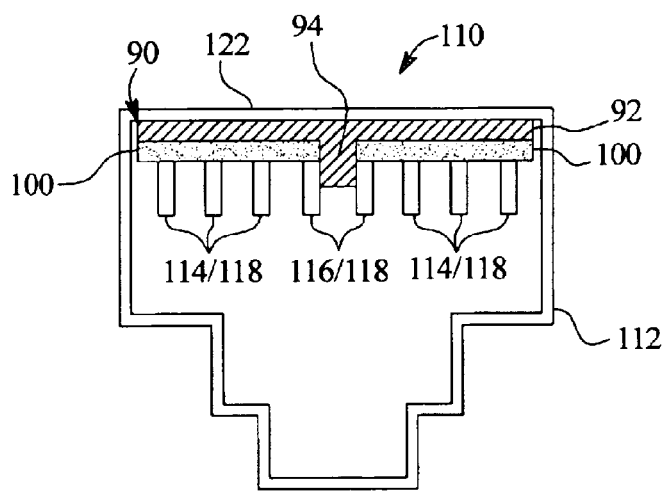
FIG. 9 is an elevation view of another embodiment of a data/telecommunications connector attached to a device according to the principles of the present invention.

Referring now to FIGS. 8 and 9, a data or telecommunications connector 110 can operate with the devices, such as the device 90, of the present invention. The devices of the present invention can operate with any type of data/telecommunication connector and are not limited to the ones illustrated herein. In the illustrated embodiment, the connector 110 is an eight conductor RJ-45 connector, which is commonly used in data networks, including local area networks ("LAN's"), wide area networks ("WAN's") and the like. In another embodiment, the connector 110 can be a six conductor RJ-11 connector, which is commonly used in residential and certain commercial telephone systems. Alternatively, connector 110 can be a USB connector or a firewire connector.

The connector 110 includes a body 112, much of which has been cut away in FIG. 8 to show the circuit protection of the present invention. The body 112 is constructed of any suitable material and in an embodiment is plastic. The body secures a number of signal conductors 114 and at least one ground conductor 116. In the illustrated embodiment, the body 112 is a jack, wherein the conductors 114 and 116 are bent appropriately to engage mating signal conductors of a plug (not illustrated). The plug is inserted into the data/telecom body 112 in the direction of the illustrated arrow When the plug inserts into the body 112, spring portions 118 of the signal conductors 114 and the one or more ground conductor 116 bend so that a spring force is applied to the electrical connection between mating conductors. It should be appreciated that the devices of the present invention can operate as readily with plug type data/telecommunications connectors.

In the illustrated embodiment, opposite ends 120 of the conductors 114 and 116 communicate electrically with device 90 set forth in FIGS. 1A to 1C. The VVM layer 100 extends along and contacts the ends 120 of the signal conductors 114. The VVM layer 100 can also contact the ground conductors 116, however, the ground conductors 116 also contact the bare metal of the member 94 of the strip 92 as illustrated. The conductive member or portion 94 forms part of a direct electrical path from the strip 92 to the earth ground or shield ground conductors 116.

Under normal conditions the VVM layer 100 is in a high impedance state, wherein no current or very little current flows from the signal conductors 114 to the conductive strip 92. When an overvoltage condition occurs along one of the signal conductors 114, the VVM layer 100 switches to a low impedance state. At least a portion of the high voltage spike travels across the VVM layer 100 to the conductive strip 92, to the portion or member 94, and then to ground via the one or more conductors 116.

The thickness of the layer 100 should be less than the spacing between the signal conductors 114, so that the shunted energy takes the path of least resistance to the strip 92 rather than to another signal conductor 114. Moreover, device 90 can be installed by the original manufacturer and modified accordingly or be installed by an enduser, OEM, etc.

FIG. 9 illustrates a different orientation for the device 90, wherein the device 90 is disposed along the top 122 (cutaway in FIG. 8) of the body 112 of the connector 110. In FIG. 9, the front of connector 110 is illustrated, wherein the plug would insert into the page to enter connector 110. Accordingly, the spring portions 118 of the conductors 114 and 116 are illustrated. In FIG. 8, the device 90 includes a separate backing 124, which is provided by the original manufacturer of the connector 110 or by the aftermarket supplier. In FIG. 9, the top 122 of the connector 110 serves as the backing to support the conductive strip 92 and the VVM layer 100. Otherwise, the embodiment of FIGS. 8 and 9 operate the same, wherein the signal conductors 114 contact the VVM layer 100 and the ground conductors 116 contact the metal member 94, which is connected electrically to the strip 92.

Because LAN's or WAN's typically encompass large distances between grounding points, ESD and EOS transients between the grounding points are serious problems. Devices such as air conditioners, heaters, elevators, copiers and laser printers, etc., also cause high levels of spikes and transients in buildings having LAN's. The protected data/telecom connector 110 protects any devices connected to a network by the connector 110 from transients or overcurrent events occurring over the data lines of the network. Likewise, the connector 110 protects the data lines of the network from any overvoltage or overcurrent event emanating from a device connected to the network.

Figure 10:
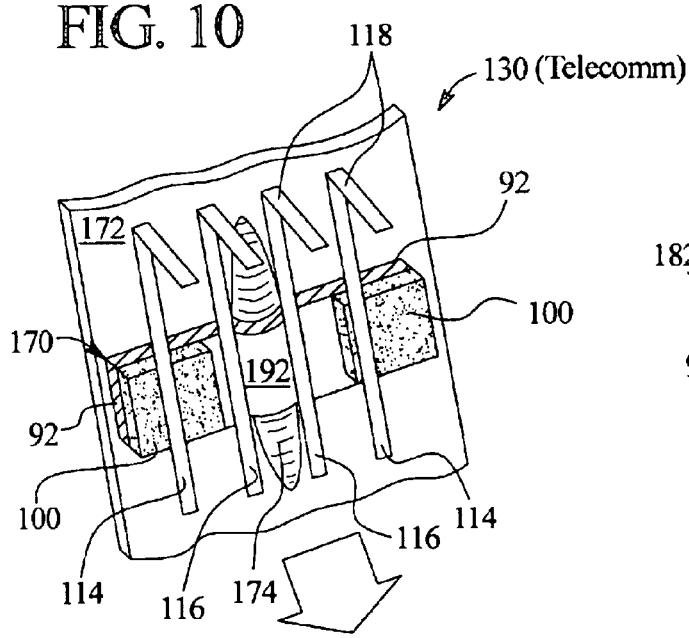
FIG. 10 is a cutaway perspective view of a further embodiment of a data/telecommunications connector attached to a device according to the principles of the present invention.

Referring now to FIG. 10 a data or telecommunications connector 130 is illustrated in operation with the device 170 discussed above in connection with FIG. 2. Device 170 can operate with any type of data/telecommunications connector. Only the relevant portion of the connector 130 is illustrated in FIG. 10. The connector 130 includes a plurality of signal conductors 114 and one or more ground conductors 116, each having with the bent ends 118, wherein the bent ends 118 mate with conductors of a data/telecom plug (not illustrated) as described above. The plug travels in the direction of the arrow when it inserts into the connector 130.

With device 170, a portion 192 of the strip 92 is bent or formed to make direct metal to metal contact with the ground conductors 116. The VVM layer 100 is discontinued on and around the portion 192 of the strip 92, so that the strip 92 can make contact with the ground conductors 116. The same side of the strip 92 that makes contact with the ground conductors 116 also attaches to the VVM layer 100.

As with FIG. 9, the top of the connector 130 can provide the insulative backing, 172, which is disposed on the side of the strip 92 opposite the side onto which the VVM layer 100 is placed. The insulative backing 172 can be made of any type of dielectric material, such as plastic. Device 170 can be installed during the original assembly of the connector 130 or can be installed as an aftermarket device after the first sale of the connector. To this end, the backing 172 can be formed separately and snap-fit or press-fit to connector 130.

The backing 172 includes a projection 174 that fills-in or follows the bent portion 192 of the strip 92. The projection 174 applies a mechanical force to the bent portion 192 of the strip 92 and helps to keep the strip 92 pressed against the ground conductors 116. The thickness of VVM layer 100 should be less than the distance between the signal conductors 114.

Normally, no current or little current flows from the signal conductors 114 through the high impedance VVM layer 100 to the strip 92. When an overvoltage condition is present on any of the signal conductors 114, the VVM layer 100 switches to a low impedance state and allows current to shunt through to the strip 92, to the bent portion 192 of the strip 92, and to the one or more ground conductors 116.

Figure 11:
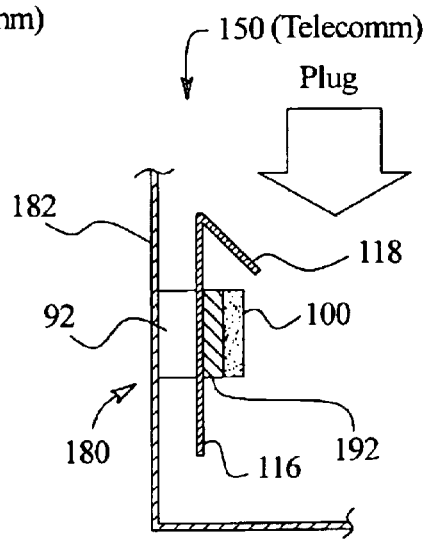
FIG. 11 is a sectioned elevation view of yet another embodiment of a data/telecommunications connector attached to a device according to the principles of the present invention.

Referring now to FIG. 11, a section view of the device 180 discussed above in connection with FIG. 3 is illustrated in operation with the data/telecommunications connector 150. The device 180 includes the conductive strip 92. One side of strip 92 includes a deposited VVM layer 100. A portion 192, shown in cross-section here, of the strip 92 is bent or formed to make direct metal to metal contact with the ground conductors 116. The VVM layer 100 is continuous on and around the portion 192 of the strip 92. Here, the side of the strip 92 opposite from the side attached to the VVM layer 100 makes contact with the ground conductors 116 as illustrated.

The device 180 also includes an insulative backing 182 disposed on the side of the strip 92 opposite the side onto which the VVM layer 100 is placed. The insulative backing can be installed during the original assembly of the connector 150 or can be installed as an aftermarket device after the first sale of the connector. To this end, the backing 182 can be part of the original assembly of the connector, e.g., molded integrally with the connector housing. Alternatively, the backing 182 can be formed with snap-fits or be formed to press-fit to the connector for aftermarket connections.

While various embodiments of the devices of the present invention are illustrated operating with specific types of connectors, the devices are not limited to applications with the connectors illustrated with the devices. The present invention expressly includes any of the devices illustrated herein being operable with any of the connectors illustrated herein. It should also be understood that various changes and modifications to the presently preferred embodiments described herein will be apparent to those skilled in the art. Such changes and modifications may be made without departing from the spirit and scope of the present invention and without diminishing its attendant advantages.

The invention is claimed as follows:

1. A device for providing circuit protection to a plurality of signal conductors of a connector comprising:
   a conductive strip;
   a layer of voltage variable material ("VVM") disposed on a side of the strip, the layer having a surface area sufficient to contact the plurality of signal conductors; and
   a conductive member extending from the side of the conductive strip, the strip, VVM and member configured so that the member contacts at least one ground conductor of the connector and so that the VVM contacts a plurality of signal conductors when the strip is positioned onto the connector.

2. The device of claim 1, wherein the VVM layer has a thickness that is less than a smallest distance between any two of the signal conductors.

3. The device of claim 1, wherein the member extends further away from the side than does a thickness of the VVM layer.

4. The device of claim 1, wherein the member extends away from the side a distance that is approximately the same as the thickness of the layer.

5. The device of claim 1, wherein the side is a first side and which includes an insulative backing disposed on a second side of the conductive strip.

6. The device of claim 1, wherein the conductive strip is integrally attached to the connector before a first sale of the connector.

7. The device of claim 1, wherein the conductive strip is attachable to the connector after a first sale of the connector.

8. The device of claim 1, wherein the conductive strip and VVM layer are shaped and sized to operate with one of the connectors selected from the group consisting of: a socket, a computer connector and a telecommunications connector.

9. A device for providing circuit protection to a plurality of signal conductors of a connector comprising:
- a formed conductive strip; and
- a layer of voltage variable material ("VVM") disposed on a first side of the conductive strip, the VVM layer having a surface area sufficient to contact the signal conductors, the conductive strip formed so that when the VVM layer on the first side of the strip contacts the signal conductors, a second side of the conductive strip bends around and contacts at least one ground conductor.

10. The device of claim 9, wherein the VVM layer follows a contour defined by the formed conductive strip.

11. The device of claim 9, wherein the VVM layer discontinues at a portion of the conductive strip formed to contact the ground conductor.

12. The device of claim 9, wherein the VVM layer has a thickness that is less than a smallest distance between any two of the signal conductors.

13. The device of claim 9, which includes an insulative backing abutting at least a portion the second side of the conductive strip.

14. The device of claim 9, wherein the conductive strip is integrally attached to the connector before a first sale of the connector.

15. The device of claim 9, wherein the conductive strip is attachable to the connector after a first sale of the connector.

16. The device of claim 9, wherein the conductive strip and VVM layer are shaped and sized to operate with one of the connectors selected from the group consisting of: a socket, a computer connector and a telecommunications connector.

17. A device for providing circuit protection to a plurality of signal conductors of a connector comprising:
- a conductive strip having a first side and a second side;
- an insulative backing abutting the first side of the strip, the backing having a projection; and
- a layer of voltage variable material ("VVM") disposed on a first portion of the second side of the conductive strip, the layer having a surface area sufficient to contact the signal conductors, and wherein the conductive strip, VVM and projection are configured so that when the VVM layer contacts the signal conductors, the projection holds a second exposed portion of the second side of the conductive strip against at least one ground conductor of the connector.

18. The device of claim 17, wherein the VVM layer has a thickness that is less than a smallest distance between any two of the signal conductors.

19. The device of claim 17, wherein the conductive strip is integrally attached to the connector before a first sale of the connector.

20. The device of claim 17, wherein the conductive strip is attachable to the connector after a first sale of the connector.

21. The device of claim 17, wherein the conductive strip and VVM layer are shaped and sized to operate with one of the connectors selected from the group consisting of: a socket, a computer connector and a telecommunications connector.

* * * * *